(12) United States Patent
Yabu et al.

(10) Patent No.: US 11,348,757 B2
(45) Date of Patent: May 31, 2022

(54) CHARGED PARTICLE BEAM DEVICE

(71) Applicant: Hitachi High-Tech Corporation, Tokyo (JP)

(72) Inventors: Shuhei Yabu, Tokyo (JP); Michio Hatano, Tokyo (JP); Shin Imamura, Tokyo (JP); Masaaki Komatsu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/260,494

(22) PCT Filed: Jul. 19, 2018

(86) PCT No.: PCT/JP2018/027070
§ 371 (c)(1),
(2) Date: Jan. 14, 2021

(87) PCT Pub. No.: WO2020/016988
PCT Pub. Date: Jan. 23, 2020

(65) Prior Publication Data
US 2021/0272768 A1 Sep. 2, 2021

(51) Int. Cl.
H01J 37/244 (2006.01)
G02B 1/04 (2006.01)
(Continued)

(52) U.S. Cl.
CPC ............ *H01J 37/244* (2013.01); *G02B 1/041* (2013.01); *G02B 19/0009* (2013.01);
(Continued)

(58) Field of Classification Search
CPC ...... H01J 37/244; H01J 37/226; G02B 1/041; G02B 1/04; G02B 19/0009
See application file for complete search history.

(56) References Cited

U.S. PATENT DOCUMENTS 3,472,997 A * 10/1969 Fair ............... H01J 37/3005
219/121.11
4,179,604 A * 12/1979 Christou ............... G01T 1/20
250/305
(Continued)

FOREIGN PATENT DOCUMENTS

JP 2001-126655 A 5/2001
JP 2006-228586 A 8/2006
(Continued)

OTHER PUBLICATIONS

International Search Report (PCT/ISA/210) issued in PCT Application No. PCT/JP2018/027070 dated Aug. 28, 2018 with English translation (three (3) pages).
(Continued)

*Primary Examiner* — David A Vanore
(74) *Attorney, Agent, or Firm* — Crowell & Moring LLP

(57) ABSTRACT

In order to improve a yield of light generated by a collision between secondary electrons and gas molecules, the invention provides a charged particle beam device including: a charged particle beam source configured to irradiate a sample with a charged particle beam; a sample chamber configured to hold the sample and a gas molecule; a positive electrode configured to form an electric field that accelerates a secondary electron emitted from the sample; a photodetector configured to detect light generated by a collision between the accelerated secondary electron and the gas molecule; and a light condensing unit disposed between the sample and the photodetector, having a light emitting space in which the light is generated, and configured to condense the light generated in the light emitting space on a photodetector side.

14 Claims, 6 Drawing Sheets

(51) Int. Cl.
*G02B 19/00* (2006.01)
*H01J 37/22* (2006.01)

(52) U.S. Cl.
CPC ... *H01J 37/226* (2013.01); *H01J 2237/04735* (2013.01); *H01J 2237/2445* (2013.01)

(56) References Cited

U.S. PATENT DOCUMENTS

| | | | | |
|---|---|---|---|---|
| 4,900,932 | A * | 2/1990 | Schafer | G01N 23/2254 250/216 |
| 4,962,306 | A * | 10/1990 | Hodgson | H01J 37/244 250/305 |
| 5,408,098 | A * | 4/1995 | Wells | H01J 37/244 250/305 |
| 7,964,846 | B2 * | 6/2011 | Mooney | H01J 37/224 250/311 |
| 8,648,301 | B2 * | 2/2014 | Bean | H01J 37/228 250/311 |
| 10,049,855 | B2 * | 8/2018 | Guerra | H01J 37/3005 |
| 10,241,062 | B2 * | 3/2019 | Ominami | G01N 23/2204 |
| 10,777,379 | B1 * | 9/2020 | Hosoya | H01J 37/28 |
| 11,183,377 | B2 * | 11/2021 | Bevis | G01T 1/2928 |
| 2005/0045832 | A1 * | 3/2005 | Kelly | H01J 37/244 250/397 |
| 2005/0173644 | A1 * | 8/2005 | Gnauck | H01J 37/244 250/370.11 |
| 2006/0186337 | A1 | 8/2006 | Hatano et al. | |
| 2008/0185509 | A1 * | 8/2008 | Knowles | H01J 37/256 250/251 |
| 2011/0291010 | A1 * | 12/2011 | Katane | H01J 37/244 250/310 |
| 2013/0234032 | A1 * | 9/2013 | Wang | G01T 1/20 250/368 |
| 2014/0374594 | A1 * | 12/2014 | Kaneko | H01J 37/244 250/311 |
| 2015/0090889 | A1 * | 4/2015 | Kuroda | G01J 1/42 250/362 |

FOREIGN PATENT DOCUMENTS

| | | |
|---|---|---|
| JP | 2010-182550 A | 8/2010 |
| JP | 2013-225530 A | 10/2013 |

OTHER PUBLICATIONS

Japanese-language Written Opinion (PCT/ISA/237) issued in PCT Application No. PCT/JP2018/027070 dated Aug. 28, 2018 (three (3) pages).

* cited by examiner

[FIG. 1]
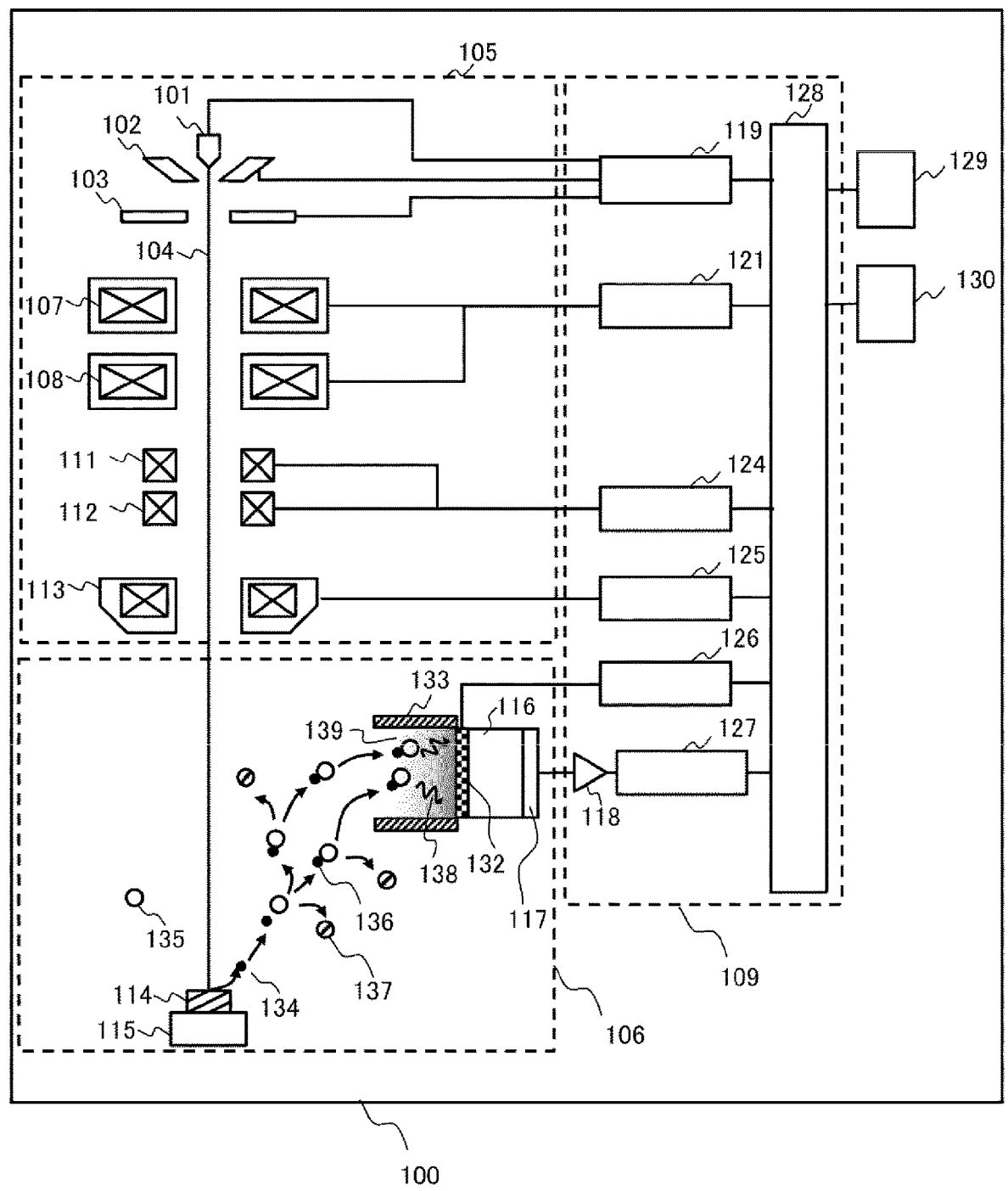

[FIG. 2]
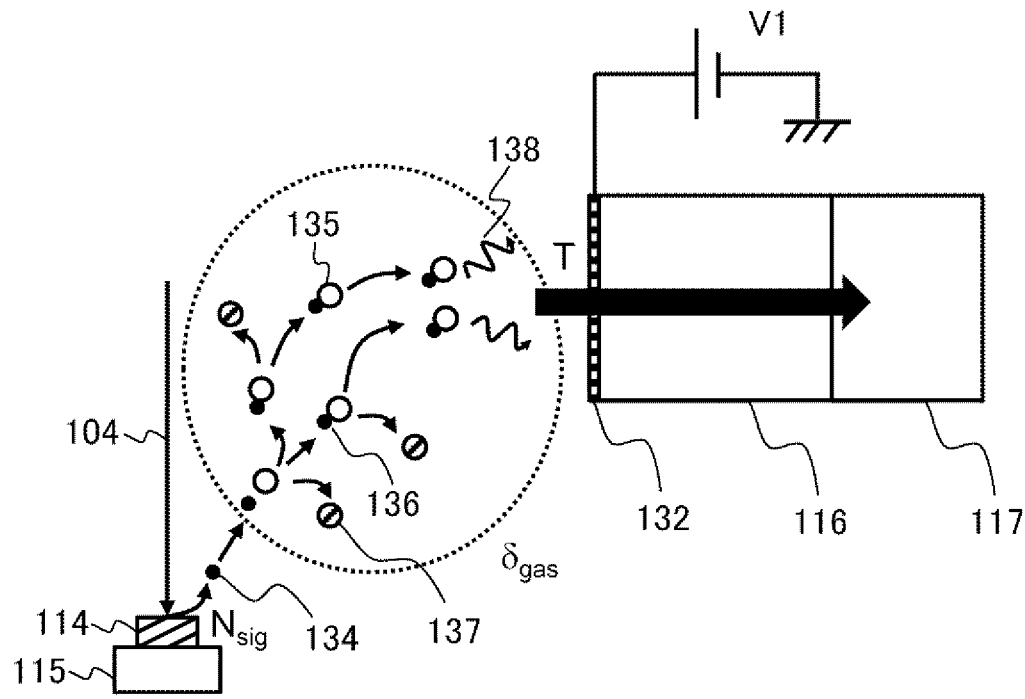
[FIG. 3]
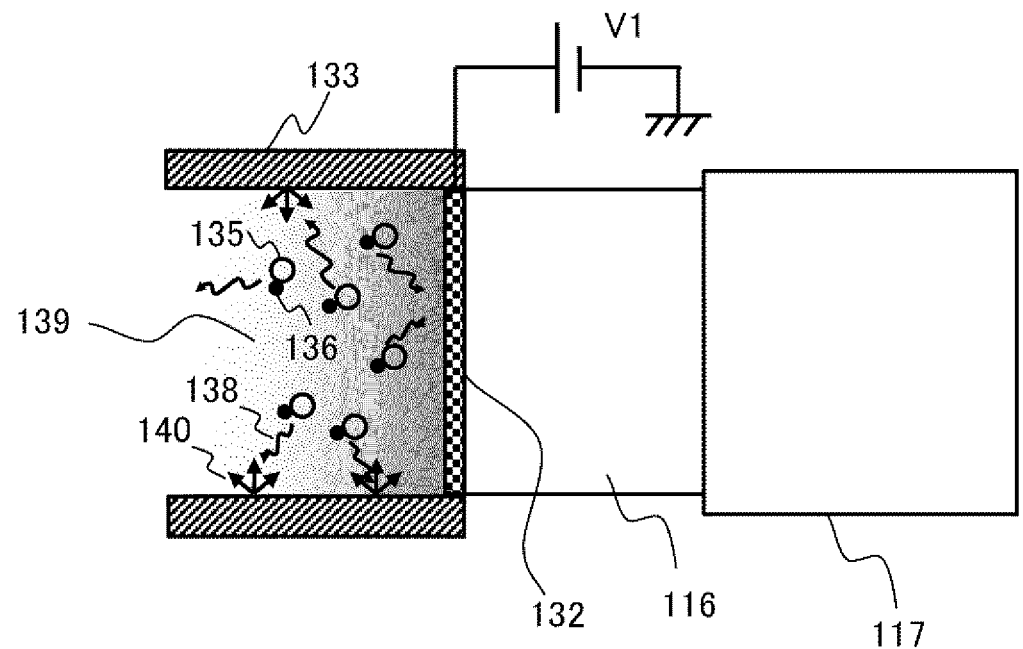

[FIG. 4]
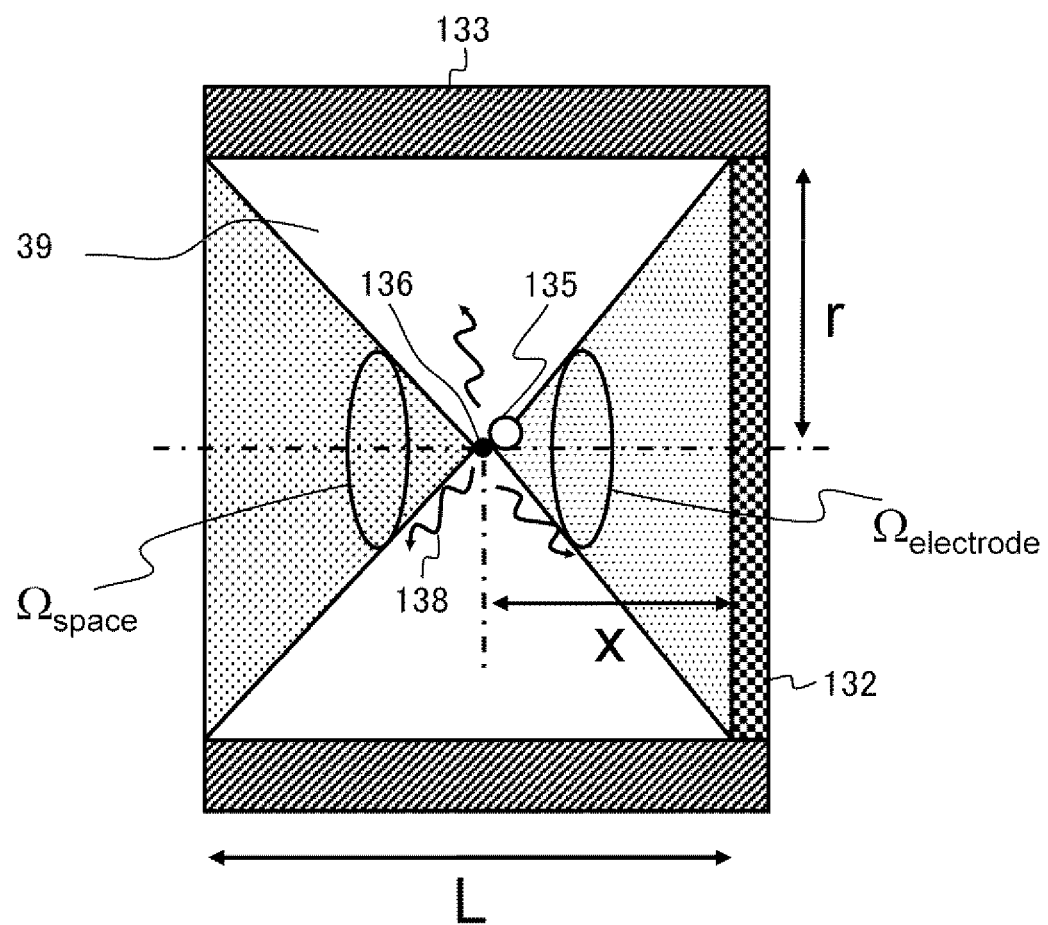

[FIG. 5]
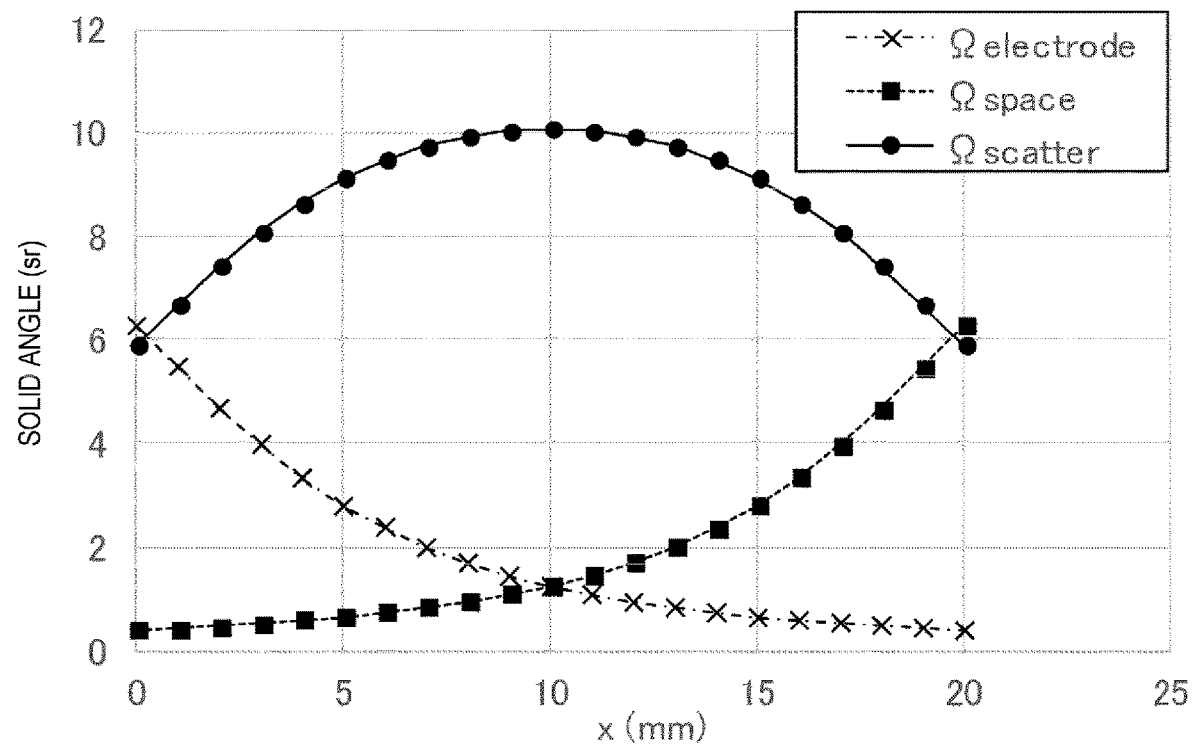
[FIG. 6]
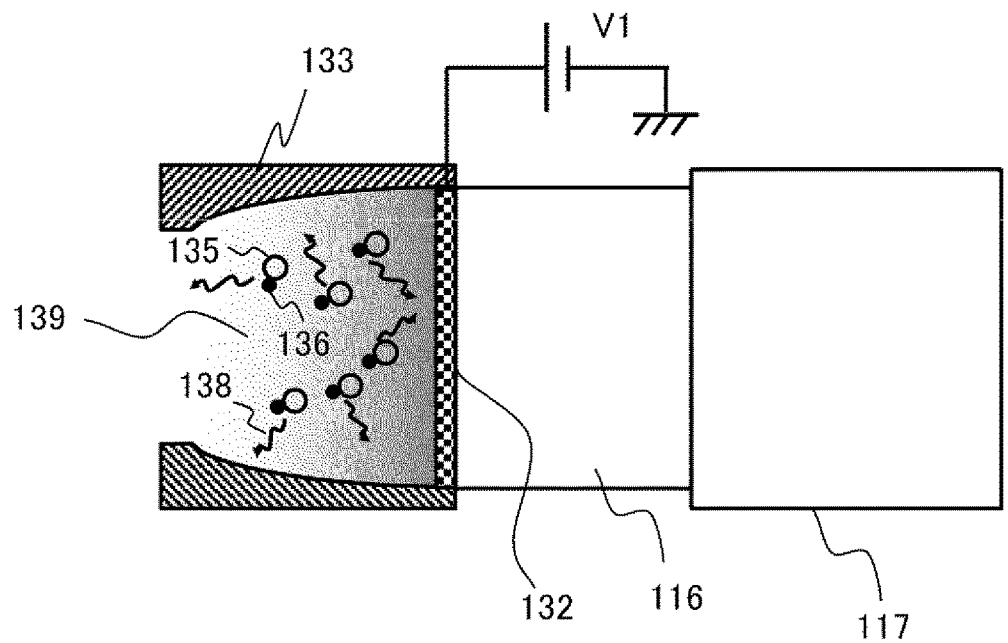

[FIG. 7]
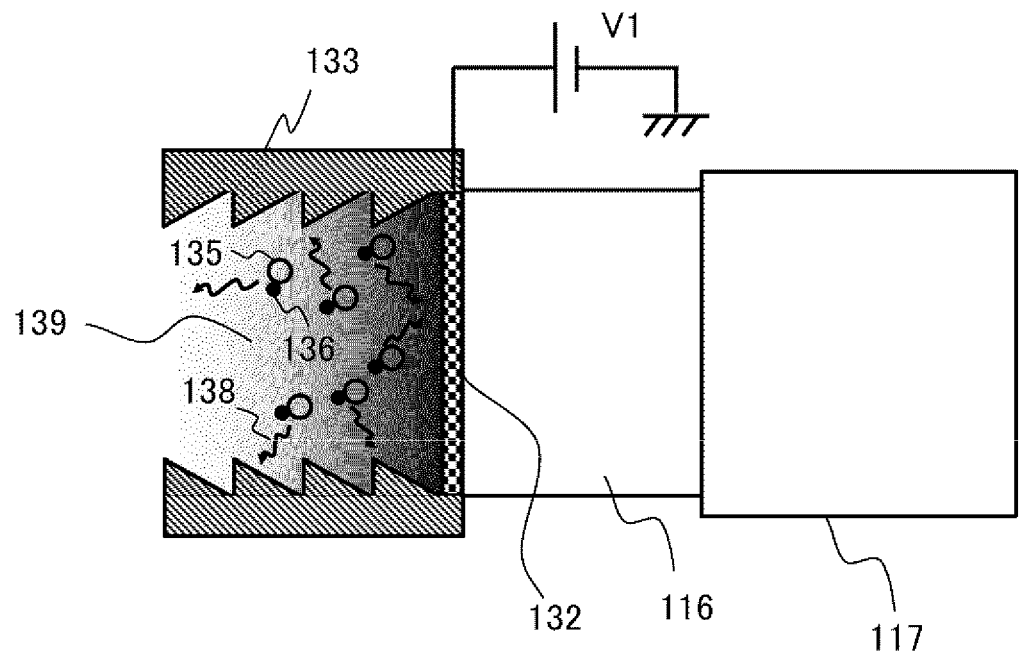
[FIG. 8]
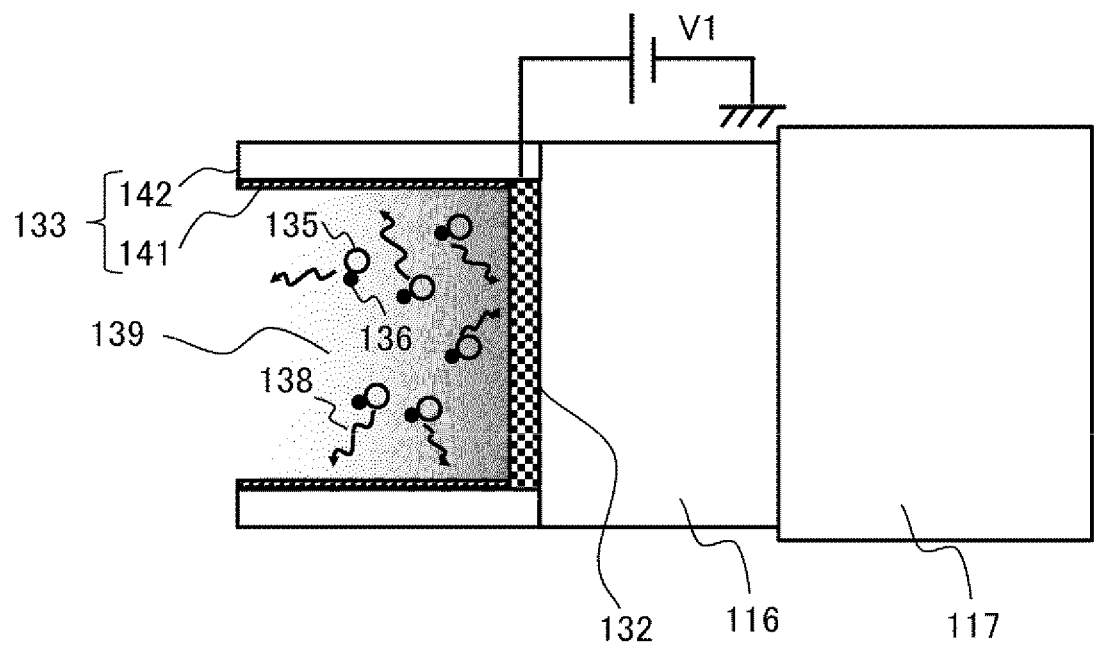

[FIG. 9]
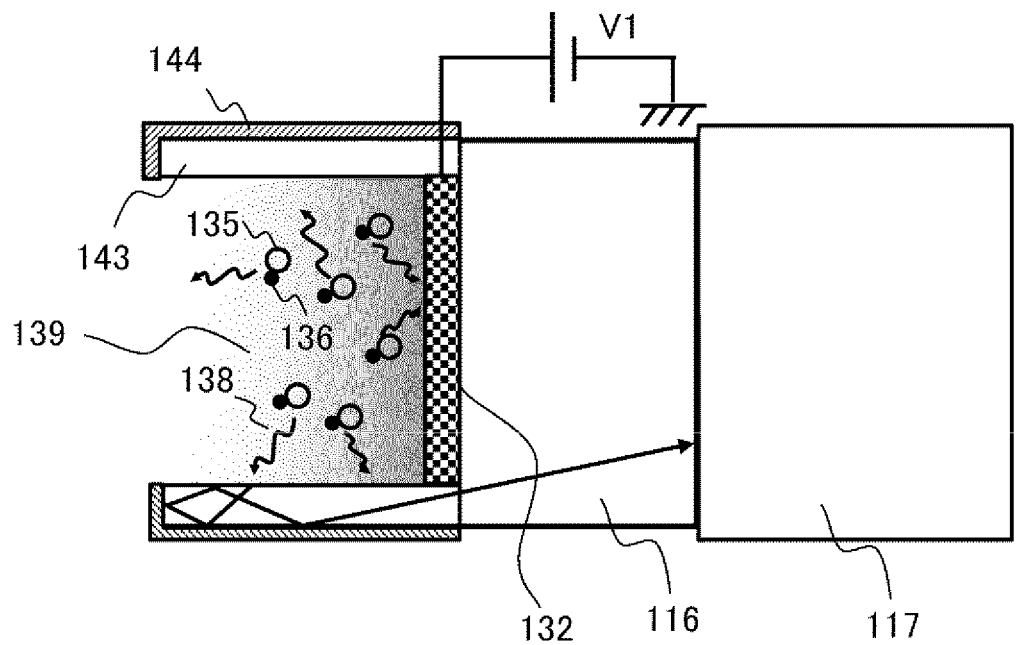
[FIG. 10]
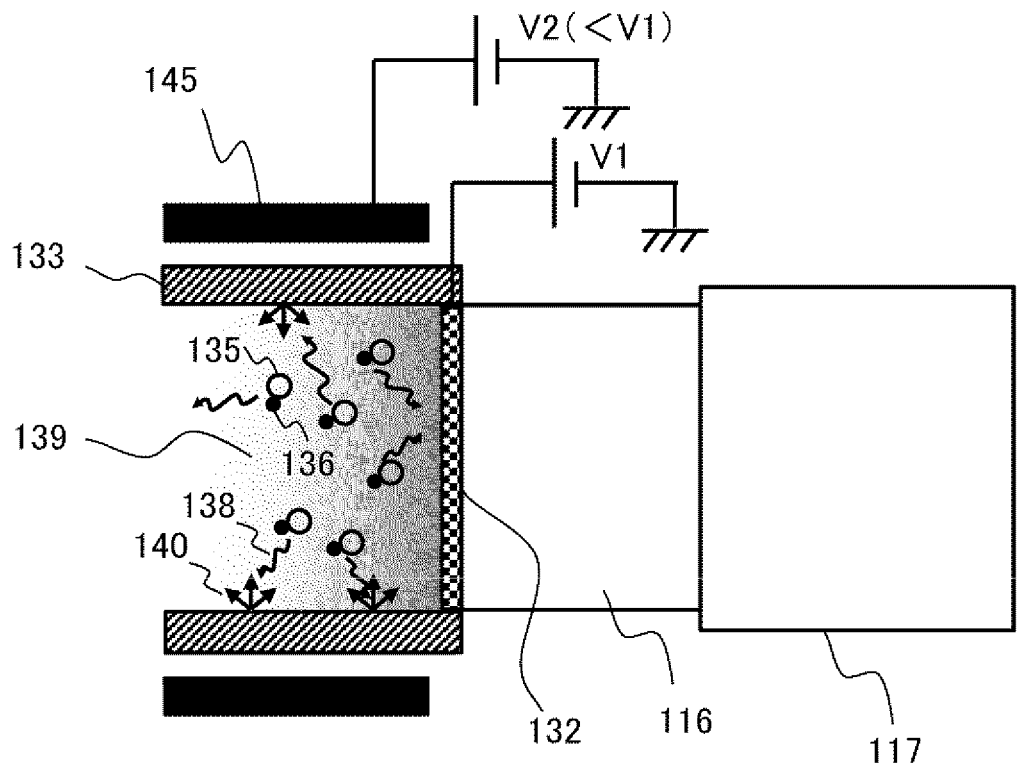

CHARGED PARTICLE BEAM DEVICE

TECHNICAL FIELD

The present invention relates to a charged particle beam device, and particularly relates to a technique for accelerating secondary electrons emitted from a sample to collide with gas molecules remaining in a sample chamber, and efficiently detecting light generated at a time of the collision.

BACKGROUND ART

A charged particle beam device is a device that irradiates a sample with a charged particle beam, such as an electron beam, and detects charged particles such as secondary electrons emitted from the sample to form an image for observing the sample. Normally, a sample chamber of the charged particle beam device is maintained at a high vacuum of $10^{-1}$ Pa or less, but when observing with reduced charge on a sample surface or when observing a sample containing a liquid, it is necessary to set the sample chamber to a low vacuum of about several Pa to several 1000 Pa. In detection of secondary electrons under a low vacuum, a technique is used for accelerating secondary electrons to collide with gas molecules remaining in the sample chamber and detecting light generated at a time of a collision.

PTL 1 discloses that, in order to efficiently detect light under low vacuum, a transmission wavelength of a light guide and a detection wavelength of a photomultiplier tube are optimized by focusing on a fact that a wavelength of light to be generated is in a range from a vacuum ultraviolet region to a visible light region.

CITATION LIST

Patent Literature

PTL 1: JP-A-2013-225530

SUMMARY OF INVENTION

Technical Problem

However, PTL 1 does not take into consideration a yield of light incident on a light guide and a photomultiplier tube. Since light generated by a collision between secondary electrons and gas molecules is isotropically emitted, the light emitted toward the light guide is detected, but the light emitted in other directions is deactivated.

An object of the invention is to provide a charged particle beam device that improves a yield of light generated by a collision between secondary electrons and gas molecules.

Solution to Problem

In order to achieve the above object, the invention is characterized in that a light condensing unit configured to condense light generated by a collision between secondary electrons and gas molecules on a photodetector side is disposed between a sample and a photodetector.

More specifically, the invention provides a charged particle beam device including: a charged particle beam source configured to irradiate a sample with a charged particle beam; a sample chamber configured to hold the sample and a gas molecule; a positive electrode configured to form an electric field that accelerates a secondary electron emitted from the sample; a photodetector configured to detect light generated by a collision between the accelerated secondary electron and the gas molecule; and a light condensing unit disposed between the sample and the photodetector, having a light emitting space in which the light is generated, and configured to condense the light generated in the light emitting space on a photodetector side.

Advantageous Effect

According to the invention, it is possible to provide the charged particle beam device that improves a yield of light generated by the collision between secondary electrons and gas molecules.

BRIEF DESCRIPTION OF DRAWINGS

FIG. 1 is a diagram showing an overall configuration of a scanning electron microscope according to a first embodiment.

FIG. 2 is a diagram showing detection of light generated when secondary electrons emitted from a sample are accelerated and collide with gas molecules.

FIG. 3 is a diagram showing a light condensing unit according to the first embodiment.

FIG. 4 is a diagram showing a solid angle viewed by light generated in a light emitting space in the light condensing unit.

FIG. 5 is a graph showing an example of a relationship between the solid angle viewed by light and a position at which the light is generated.

FIG. 6 is a diagram showing a light condensing unit according to a second embodiment.

FIG. 7 is a diagram showing a light condensing unit according to a third embodiment.

FIG. 8 is a diagram showing a light condensing unit according to a fourth embodiment.

FIG. 9 is a diagram showing a light condensing unit according to a fifth embodiment.

FIG. 10 is a diagram showing a light condensing unit and a second positive electrode according to a sixth embodiment.

DESCRIPTION OF EMBODIMENTS

Embodiments of a charged particle beam device according to the invention will be described below with reference to the figures. The charged particle beam device is a device that irradiates a sample with a charged particle beam in which charged particles emitted from a charged particle source are focused by a lens. For example, there are devices such as a scanning electron microscope and a transmission electron microscope in which a sample is observed by irradiating the sample with an electron beam, and a focused ion beam device that observes a sample by irradiating the sample with a focused ion beam. Hereinafter, a scanning electron microscope (SEM) will be described as an example of the charged particle beam device.

In all the drawings used in the description of the embodiment, components having the same function are denoted by the same reference numerals in principle, and the description thereof is not repeated. In addition, hatching may be added even in a plan view so as to make the drawings easy to see.

First Embodiment

FIG. 1 shows an overall configuration of a scanning electron microscope 100. The scanning electron microscope 100 includes a lens barrel unit 105, a sample chamber 106, a control unit 109, an input and output unit 129, and a storage unit 130.

The lens barrel unit 105 includes a cathode 101, a wehnelt 102, an anode 103, a first condenser lens 107, a second condenser lens 108, an upper deflection coil 111, a lower deflection coil 112, and an objective lens 113. The sample chamber 106 is maintained at a low vacuum of several Pa to several 1000 Pa, and includes a sample stage 115, a light guide 116, a photodetector 117, a positive electrode 132, and a light condensing unit 133. The control unit 109 includes a high-voltage control circuit 119, a condenser lens control circuit 121, a deflection control circuit 124, an objective lens control circuit 125, a positive electrode power supply 126, an amplifier 118, a signal processing circuit 127, and a computer 128 to control the lens barrel unit 105 and the like. The input and output unit 129 includes a mouse, a keyboard, and a display, and is used for inputting an observation condition and displaying an observation image. The storage unit 130 is, for example, a hard disk drive, and stores the observation condition and the observation image.

When a voltage corresponding to the observation condition is applied to the cathode 101, the wehnelt 102, and the anode 103 by the high-voltage control circuit 119, an electron beam 104 is emitted from the cathode 101. After the electron beam 104 is focused by the first condenser lens 107 and the second condenser lens 108, the electron beam 104 is focused on a sample 114 placed on the sample stage 115 by the objective lens 113. The electron beam 104 focused on the sample 114 is simultaneously scanned on the sample 114 by the upper deflection coil 111 and the lower deflection coil 112. Secondary electrons 134 are generated from the sample 114 with irradiation of the electron beam 104. In the scanning electron microscope 100, an observation image is generated by associating a position of the sample 114 irradiated with the electron beam 104 with a generation amount of the secondary electrons 134.

Measurement of the generation amount $N_{sig}$ of the secondary electrons 134 will be described with reference to FIG. 2. The secondary electrons 134 generated from the sample 114 are accelerated toward the positive electrode 132 by an electric field formed by the positive electrode 132 to which a positive voltage of about 1 V to 600 V is applied. The accelerated secondary electrons 134 collide with gas molecules 135 held in the sample chamber 106 to generate electrons 136 and ions 137. The generated electrons 136 are accelerated by the electric field formed by the positive electrode 132 and collide with the gas molecules 135 to further generate the electrons 136 and the ions 137. That is, repeated collisions between the electrons 136 and the gas molecules 135 cause an electron avalanche, and the number of electrons 136 and ions 137 increases exponentially as the electrons 136 and the gas molecules 135 approach the positive electrode 132.

Further, light 138 is generated by a collision between the secondary electrons 134 or the electrons 136 and the gas molecules 135, and a generation amount of the light 138 is amplified by $\delta_{gas}$ times in an electron avalanche process. A wavelength of the generated light 138 varies depending on a type of the gas molecules 135. For example, when the gas molecule 135 is nitrogen, the light 138 having a wavelength mainly of 300 nm to 450 nm including a peak of 338 nm is generated. Since the generation amount of the amplified light 138 is proportional to a generation amount $N_{sig}$ of the secondary electrons 134, the generation amount of the secondary electrons 134 is measured by detecting the light 138 by the photodetector 117.

For example, a photomultiplier tube or a photodiode is used for the photodetector 117. Output of the photodetector 117 is amplified by the amplifier 118 and transmitted to the signal processing circuit 127, and an observation image is generated by the signal processing circuit 127. The light guide 116 is provided in front of the photodetector 117 as necessary. The light guide 116 is preferably formed of a material having a high transmittance with respect to the wavelength of the light 138. The positive electrode 132 is provided in front of the light guide 116 when the light guide 116 is provided, and is provided in front of the photodetector 117 when the light guide 116 is not provided. The positive electrode 132 preferably has a shape having a high aperture ratio, for example, a ring shape or a mesh shape, or is an electrode that is transparent to the wavelength of the light 138 so that the light 138 can pass through.

Since the light 138 generated in the electron avalanche process is isotropically emitted, only a part of the light 138 is incident on the light guide 116 or the photodetector 117. The light 138 that does not enter the light guide 116 or the photodetector 117 is deactivated, which reduces a yield T of the light 138 by the photodetector 117 and deteriorates an image quality of the generated observation image. Therefore, in the invention, the light condensing unit 133 that condenses the light 138 on a photodetector 117 side is provided between the sample 114 and the photodetector 117, and the yield T of the light 138 is improved by the photodetector 117.

The light condensing unit 133 according to the present embodiment will be described with reference to FIG. 3. In the present embodiment, the light guide 116 is provided. The light condensing unit 133 is formed of a material having a higher diffuse reflectance than that of the positive electrode 132, has a cylindrical shape, and is disposed in front of the light guide 116 so as to cover the positive electrode 132. The light condensing unit 133 is provided, so that the light 138 that has been deactivated without being incident on the light guide 116 out of the light 138 generated in a light emitting space 139, which is a space in the light condensing unit 133, is diffusely reflected on an inner peripheral surface of the light condensing unit 133 facing the light emitting space 139 and becomes diffused light 140. Light reflected on a light guide 116 side out of the diffused light 140 is detected by the photodetector 117 via the light guide 116. That is, since a part of the light 138 that has been previously deactivated is condensed on the photodetector 117 side by the light condensing unit 133 and detected by the photodetector 117, the yield T of the light 138 can be improved.

As the material of the light condensing unit 133, a fluorine-based resin such as polytetrafluoroethylene (PTFE) or expanded polytetrafluoroethylene (ePTFE) having an amorphous crystal structure in part is preferable. Since the fluorine-based resin has a high diffuse reflectance at a wavelength of 300 nm to 450 nm, the yield T of the light 138 generated when the secondary electrons 134 or the electrons 136 collide with nitrogen can be improved. Since the diffuse reflectance of the fluorine-based resin depends on a thickness, it is preferable to set the thickness of the light condensing unit 133 so that the diffuse reflectance is, for example, 80% or more at a wavelength of 300 nm to 450 nm.

The light condensing unit 133 may be disposed at any position between the sample 114 and the photodetector 117. However, since the generation amount of the light 138 is large at a position where an intensity of the electric field formed by the positive electrode 132 is large, the light condensing unit 133 is preferably disposed near the positive electrode 132 having a large intensity of the electric field, for example, so as to cover the positive electrode 132. In order to maintain the intensity of the electric field near the positive electrode 132, the light condensing unit 133 is preferably electrically insulated from the positive electrode 132.

An effect of the light condensing unit 133 according to the present embodiment will be described with reference to FIGS. 4 and 5. FIG. 4 is a diagram showing a solid angle at which the positive electrode 132 or the like are viewed by the light 138 generated on a central axis of the light condensing unit 133 in the light emitting space 139. Since the light generated in the light emitting space 139 is isotropically emitted, a magnitude of each solid angle corresponds to the amount of light 138 reaching the positive electrode 132 or the like. In FIG. 4, an inner diameter of the light condensing unit 133 is 2r, and a length from a surface of the positive electrode 132 on a sample 114 side to a front end of the light condensing unit 133 is L. When a position where the light 138 is generated is x and a position of the surface of the positive electrode 132 on the sample 114 side is x=0, the solid angle $\Omega_{electrode}$ at which the positive electrode 132 is viewed at x is given by the following formula.

$$\Omega_{electrode} = 2\pi(1-\cos(\tan^{-1}(r/x))) \quad (1)$$

Further, the solid angle $\Omega_{space}$ at which an opening of the light condensing unit 133 on the sample 114 side is viewed at x is given by the following formula.

$$\Omega_{space} = 2\pi(1-\cos(\tan^{-1}(r/(L-x)))) \quad (2)$$

Therefore, the solid angle $\Omega_{scatter}$ at which the inner peripheral surface of the light condensing unit 133 is viewed from x is given by the following formula.

$$\Omega_{scatter} = 4\pi - \Omega_{electrode} - \Omega_{space} \quad (3)$$

FIG. 5 is a graph showing an example of a relationship between a position x where the light 138 is generated on the central axis of the light condensing unit 133 and each solid angle, obtained using formulas (1) to (3) with L=20 mm and r=7.5 mm. It can be seen from FIG. 5 that the solid angle $\Omega_{electrode}$ is large in a vicinity of the positive electrode 132, and approximately half of the light is emitted to a side of the light guide 116 or the photodetector 117, and most of the remaining light is emitted to the inner peripheral surface of the light condensing unit 133. Further, as x increases and moves away from the positive electrode 132, the light emitted to the photodetector 117 side decreases monotonically, whereas a ratio of the light emitted to the inner peripheral surface of the light condensing unit 133 increases or decreases, but maintains about half or more. Therefore, a part of the light that has been previously deactivated is detected by the photodetector 117 by providing the light condensing unit 133.

By forming the inner peripheral surface of the light condensing unit 133 with a material having a low light absorption and a high diffuse reflectance, most of the light 138 is multiple-reflected in the light emitting space 139 in the light condensing unit 133, and is confined in the light emitting space 139, so that the yield T of the light 138 is further improved. The inner diameter 2 r and the length L of the light condensing unit 133 are preferably set appropriately in accordance with a shape of the positive electrode 132 and a surrounding structure.

Second Embodiment

In the first embodiment, the light condensing unit 133 having a cylindrical shape is described. The shape of the light condensing unit 133 is not limited to a cylindrical shape, and may be any shape as long as the generated light 138 can be condensed on the photodetector 117 side. In the present embodiment, the light condensing unit 133 whose inner peripheral surface has a curved shape will be described. An overall configuration according to the present embodiment is the same as that of the first embodiment, and a description thereof will be omitted.

The light condensing unit 133 according to the present embodiment will be described with reference to FIG. 6. Similar to the first embodiment, the light condensing unit 133 according to the present embodiment is formed of a material having a high diffuse reflectance, for example, a fluorine-based resin, and has a cylindrical shape in outline. However, an inner peripheral surface has a curved shape, and an inclination angle of the inner peripheral surface with respect to the central axis of the light condensing unit 133 is set to be larger as a distance from the photodetector 117 increases.

Since the inner peripheral surface has the curved shape, the light 138 emitted to the inner peripheral surface of the light condensing unit 133 is less likely to leak from the light emitting space 139, and thus the yield T of the light 138 is further improved. When the inclination angle is too large, an opening of the light condensing unit 133 on the sample 114 side becomes narrow, the secondary electrons 134 and electrons 136 incident on the light emitting space 139 are reduced, and a generation amount of the light 138 is reduced. Therefore, the inclination angle of the inner peripheral surface with respect to the central axis of the light condensing unit 133 may be set so that a normal of the inner peripheral surface does not intersect with the positive electrode 132.

Third Embodiment

In the second embodiment, the light condensing unit 133 whose inner peripheral surface has a curved shape is described. The inner peripheral surface of the light condensing unit 133 is not limited to the curved shape, and may have any shape as long as the generated light 138 is less likely to leak from the light emitting space 139. In the present embodiment, the light condensing unit 133 having a sawtooth wave shape on the inner peripheral surface will be described. An overall configuration according to the present embodiment is the same as that of the first embodiment, and a description thereof will be omitted.

The light condensing unit 133 according to the present embodiment will be described with reference to FIG. 7. Similar to the first embodiment, the light condensing unit 133 according to the present embodiment is formed of a material having a high diffuse reflectance, for example, a fluorine-based resin, and has a cylindrical shape in outline. However, the inner peripheral surface has the sawtooth wave shape, and the sawtooth wave shape includes an inclined surface that is inclined with respect to the central axis of the light condensing unit 133 and faces the photodetector 117 side, and an orthogonal plane orthogonal to the central axis.

Since the inner peripheral surface has the sawtooth wave shape, the light 138 emitted to the inner peripheral surface of the light condensing unit 133 is less likely to leak from the light emitting space 139, and thus the yield T of the light 138 is further improved. The number of pairs of the inclined surface and the orthogonal plane is not limited to four, and may be any number. For example, when the number of pairs of the inclined surface and the orthogonal plane is one, the inner peripheral surface has a tapered shape facing the photodetector 117 side, and a shape of the light emitting space 139 is a truncated cone shape in which the photodetector 117 side is wide.

Fourth Embodiment

In the first embodiment to the third embodiment, the light condensing unit 133 formed of a single material is described. The light condensing unit 133 is not limited to a single material, and may be a combination of a plurality of materials as long as the generated light 138 can be condensed on the photodetector 117 side. In the present embodiment, the light condensing unit 133 formed of a combination of a plurality of materials will be described. An overall configuration according to the present embodiment is the same as that of the first embodiment, and a description thereof will be omitted.

The light condensing unit 133 according to the present embodiment will be described with reference to FIG. 8. The light condensing unit 133 according to the present embodiment includes a light scattering body 141 and a light condensing unit base material 142.

The light condensing unit base material 142 is formed of any material, has a cylindrical shape, and is disposed in front of the light guide 116 so as to cover the positive electrode 132. In order to maintain the intensity of the electric field near the positive electrode 132 high, the light condensing unit base material 142 is preferably formed of a material that is electrically insulated from the positive electrode 132.

The light scattering body 141 is formed of, for example, barium sulfate, alumina, titanium oxide, and is applied to an inner peripheral surface of the light condensing unit base material 142. The light scattering body 141 applied to the inner peripheral surface of the light condensing unit base material 142 forms a light diffusing surface, and diffuses and reflects the light 138 generated in the light emitting space 139.

Also in the light condensing unit 133 according to the present embodiment, similar to the first embodiment, a part of the light 138 that has been previously deactivated is condensed on the photodetector 117 side, and is detected by the photodetector 117, so that the yield T of the light 138 is improved.

A material applied on the inner peripheral surface of the light condensing unit base material 142 is not limited to the light scattering body 141, and a phosphor may be applied. The phosphor to be applied is preferably a material in which a wavelength of the light 138 generated in the light emitting space 139 is an excitation wavelength or a material that has an emission peak in a wavelength region where detection sensitivity of the photodetector 117 is high. Since the light generated from the phosphor is isotropically emitted, similarly to a case where the light scattering body 141 is applied, a part of the light 138 that has been previously deactivated is condensed on the photodetector 117 side, and the yield T of the light 138 is improved.

The light condensing unit base material 142 is not limited to a cylindrical shape. For example, the light condensing unit base material 142 having an inner peripheral surface having a curved shape according to the second embodiment or a sawtooth wave shape according to the third embodiment may be used.

Fifth Embodiment

In the first embodiment to the fourth embodiment, the light condensing unit 133 that diffusely reflects the light 138 is described. Reflection of the light 138 in the light condensing unit 133 is not limited to diffuse reflection, and may be specular reflection as long as the generated light 138 can be condensed on the photodetector 117 side. In the present embodiment, the light condensing unit 133 that specularly reflects the light 138 will be described. An overall configuration according to the present embodiment is the same as that of the first embodiment, and a description thereof will be omitted.

The light condensing unit 133 according to the present embodiment will be described with reference to FIG. 9. The light condensing unit 133 according to the present embodiment is formed of a material having a refractive index higher than a refractive index of vacuum in a wavelength region of the light 138, for example, a glass member 143 such as quartz, and has a cylindrical shape having a mirror surface on a surface thereof. By using the glass member 143 having the refractive index higher than that of the vacuum for the light condensing unit 133, the light 138 incident on the glass member 143 is repeatedly totally reflected and confined in the glass member 143, propagates toward the light guide 116, and is detected by the photodetector 117. That is, a part of the light 138 that has been previously deactivated is condensed on the photodetector 117 side, and the yield T of the light 138 is improved.

A metal coating 144 as shown in FIG. 9 may be applied to an outer surface of the glass member 143, that is, a surface not facing a light emitting space. For example, aluminum, silver, or the like is used for the metal coating 144. The metal coating 144 further improves a reflectance of the light 138 on the outer surface of the glass member 143. The glass member 143 and the light guide 116 are not limited to separate components, and may be integrated components. By using the integrated component, reflection of the light 138 at a boundary between the glass member 143 and the light guide 116 can be reduced. The glass member 143 may have any shape as long as the surface is a mirror surface, and for example, the inner peripheral surface may have a curved shape as in the second embodiment.

Sixth Embodiment

In the first to fifth embodiments, a configuration in which only the light condensing unit 133 is provided in front of the light guide 116 is described. In order to improve detection efficiency of the photodetector 117, a positive electrode different from the positive electrode 132 may be provided together with the light condensing unit 133. In the present embodiment, a configuration in which a second positive electrode is provided together with the light condensing unit 133 will be described. An overall configuration according to the present embodiment is the same as that of the first embodiment, and a description thereof will be omitted.

The present embodiment will be described with reference to FIG. 10. In the present embodiment, apart from the positive electrode 132, a second positive electrode 145 is provided in front of the light guide 116 together with the light condensing unit 133. The second positive electrode 145 is a cylindrical electrode to which a positive voltage V2 (<V1) lower than a voltage V1 applied to the positive electrode 132 is applied, and forms an electric field that attracts the secondary electrons 134 and the electrons 136 to the light emitting space 139. The light condensing unit 133 is disposed inside the second positive electrode 145. The light condensing unit 133 according to the present embodiment may be any one of the first embodiment to the fifth embodiment.

Since the secondary electrons 134 and the electrons 136 are attracted to the light emitting space 139 by an electric field formed by the second positive electrode 145, a generation amount of the light 138 in the light emitting space 139 increases, and an amount detected by the photodetector 117 can be improved. Since the positive voltage V2 applied to the second positive electrode 145 is lower than the voltage V1 applied to the positive electrode 132, the intensity of the electric field near the positive electrode 132 does not significantly decrease. Since the light 138 generated in the light emitting space 139 is condensed on the photodetector 117 side by the light condensing unit 133 as in the first embodiment to the fifth embodiment, the yield T of the light 138 is improved, and the image quality of a generated observation image can be improved.

A plurality of embodiments of the charged particle beam device according to the invention has been described above. The charged particle beam device according to the invention is not limited to the above embodiments, and constituent elements may be modified and embodied without departing from the spirit of the invention. Further, a plurality of constituent elements disclosed in the above embodiments may be appropriately combined. Furthermore, some constituent elements may be omitted from all the constituent elements shown in the above embodiments.

REFERENCE SIGN LIST

100: scanning electron microscope
101: cathode
102: wehnelt
103: anode
104: electron beam
105: lens barrel unit
106: sample chamber
107: first condenser lens
108: second condenser lens
109: control unit
111: upper deflection coil
112: lower deflection coil
113: objective lens
114: sample
115: sample stage
116: light guide
117: photodetector
118: amplifier
119: high-voltage control circuit
121: condenser lens control circuit
124: deflection control circuit
125: objective lens control circuit
126: positive electrode power supply
127: signal processing circuit
128: computer
129: input and output unit
130: storage unit
132: positive electrode
133: light condensing unit
134: secondary electron
135: gas molecule
136: electron
137: ion
138: light
139: light emitting space
140: diffused light
141: light scattering body
142: light condensing unit base material
143: glass member
144: metal coating
145: second positive electrode

The invention claimed is:

1. A charged particle beam device, comprising:
a charged particle beam source configured to irradiate a sample with a charged particle beam;
a sample chamber configured to hold the sample and a gas molecule;
a positive electrode configured to form an electric field that accelerates a secondary electron emitted from the sample;
a photodetector configured to detect light generated by a collision between the accelerated secondary electron and the gas molecule; and
a light condensing unit disposed between the sample and the photodetector, having a light emitting space in which the light is generated, and configured to condense the light generated in the light emitting space on a photodetector side.

2. The charged particle beam device according to claim 1, wherein
a material of the light condensing unit is a fluorine-based resin.

3. The charged particle beam device according to claim 2, wherein
the fluorine-based resin is polytetrafluoroethylene or expanded polytetrafluoroethylene having an amorphous crystal structure in part.

4. The charged particle beam device according to claim 3, wherein
the light condensing unit has a thickness so that a diffuse reflectance is 80% or more at a wavelength of light of 300 nm to 450 nm.

5. The charged particle beam device according to claim 1, wherein
a surface of the light condensing unit facing the light emitting space has a curved shape.

6. The charged particle beam device according to claim 5, wherein
an inclination angle of the curved shape with respect to a central axis of the light condensing unit increases as a distance from the photodetector increases.

7. The charged particle beam device according to claim 1, wherein
a surface of the light condensing unit facing the light emitting space has a sawtooth wave shape.

8. The charged particle beam device according to claim 7, wherein
the sawtooth wave shape includes an inclined surface that is inclined with respect to a central axis of the light condensing unit and faces a photodetector side, and an orthogonal plane orthogonal to the central axis.

9. The charged particle beam device according to claim 1, wherein
the condensing unit includes a light condensing unit base material, and a light scattering body or a phosphor is applied to an inner peripheral surface of the light condensing unit base material.

10. The charged particle beam device according to claim 1, wherein
the light condensing unit is a glass member having a refractive index higher than that of vacuum in a wavelength region of the light and having a mirror surface on a surface thereof.

11. The charged particle beam device according to claim 10, wherein a metal coating is applied to an outer surface of the glass member.

12. The charged particle beam device according to claim 10, further comprising:
a light guide in front of the photodetector, wherein the light guide is a component integral with the glass member.

13. The charged particle beam device according to claim 1, further comprising:
a second positive electrode to which a voltage lower than a voltage applied to the positive electrode is applied, wherein
the light condensing unit is provided inside the second positive electrode.

14. The charged particle beam device according to claim 1, wherein
the light condensing unit is electrically insulated from the positive electrode.

* * * * *